(12) United States Patent
Suganuma

(10) Patent No.: US 8,053,763 B2
(45) Date of Patent: Nov. 8, 2011

(54) ORGANIC SEMICONDUCTOR LIGHT EMITTING DEVICE AND DISPLAY DEVICE USING THE SAME

(75) Inventor: Naotoshi Suganuma, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 672 days.

(21) Appl. No.: 11/661,283

(22) PCT Filed: Aug. 26, 2005

(86) PCT No.: PCT/JP2005/015526
§ 371 (c)(1),
(2), (4) Date: Oct. 12, 2007

(87) PCT Pub. No.: WO2006/025275
PCT Pub. Date: Mar. 9, 2006

(65) Prior Publication Data
US 2008/0142789 A1 Jun. 19, 2008

(30) Foreign Application Priority Data
Aug. 30, 2004 (JP) ................................. 2004-250601

(51) Int. Cl.
*H01L 51/10* (2006.01)
*H01L 51/52* (2006.01)
(52) U.S. Cl. ............... 257/40; 257/83; 257/E51.006; 257/E51.018
(58) Field of Classification Search ............ 257/40, 257/83, 91, E51.001–E51.052; 438/99
See application file for complete search history.

(56) References Cited

U.S. PATENT DOCUMENTS

| | | | |
|---|---|---|---|
| 6,037,718 A | 3/2000 | Nagami et al. | |
| 6,150,668 A * | 11/2000 | Bao et al. | 257/40 |
| 6,603,139 B1 * | 8/2003 | Tessler et al. | 257/40 |
| 6,650,018 B1 * | 11/2003 | Zhao et al. | 257/775 |
| 6,720,572 B1 * | 4/2004 | Jackson et al. | 257/40 |
| 6,900,457 B2 * | 5/2005 | Toguchi et al. | 257/40 |
| 6,930,322 B1 * | 8/2005 | Mori | 257/40 |

(Continued)

FOREIGN PATENT DOCUMENTS

JP 10-214044 8/1998

(Continued)

OTHER PUBLICATIONS

Tomo Sakanue et al., Visible light emission of from polymer-based filed-effext transistors, Applied Physics Letters, Apr. 19, 2004.

*Primary Examiner* — Matthew W Such
(74) *Attorney, Agent, or Firm* — Rabin & Berdo, P.C.

(57) ABSTRACT

An organic semiconductor light emitting device wherein efficiency of injecting a carrier from an organic semiconductor active layer to an organic semiconductor light emitting part is improved. The organic semiconductor light emitting device includes the organic semiconductor active layer having a source area and a drain area set at an interval of a channel length, a source electrode joined to the source area, the organic semiconductor light emitting part joined to the drain area, a drain electrode joined to the organic semiconductor light emitting part, and a gate electrode arranged to face the organic semiconductor active layer with an insulating film interposed. The organic semiconductor light emitting part includes an organic semiconductor light emitting layer which receives electrons and holes from the drain electrode and holes from the drain electrode and the organic semiconductor active layer and generates light by recombination of the electrons and the holes.

11 Claims, 11 Drawing Sheets

U.S. PATENT DOCUMENTS

| | | |
|---|---|---|
| 7,119,366 B2 * | 10/2006 | Kondoh .......................... 257/59 |
| 7,868,319 B2 * | 1/2011 | Adachi et al. .................. 257/40 |
| 2002/0167280 A1 | 11/2002 | Hayashi et al. |
| 2003/0213952 A1 * | 11/2003 | Iechi et al. ..................... 257/40 |
| 2003/0218166 A1 * | 11/2003 | Tsutsui .......................... 257/40 |
| 2004/0041146 A1 * | 3/2004 | Cheng et al. .................. 257/40 |
| 2005/0067947 A1 | 3/2005 | Hayashi et al. |
| 2006/0208251 A1 * | 9/2006 | Yoshizawa ..................... 257/40 |
| 2006/0261329 A1 * | 11/2006 | Muccini et al. ................ 257/40 |

FOREIGN PATENT DOCUMENTS

| | | | |
|---|---|---|---|
| JP | 2000-029403 | | 1/2000 |
| JP | 2002-512451 | | 4/2002 |
| JP | 2002343578 | | 11/2002 |
| JP | 2003-282884 | | 10/2003 |
| JP | 2003282884 A | * | 10/2003 |
| JP | 2004-087458 | | 3/2004 |
| JP | 2005209455 A | * | 8/2005 |

* cited by examiner

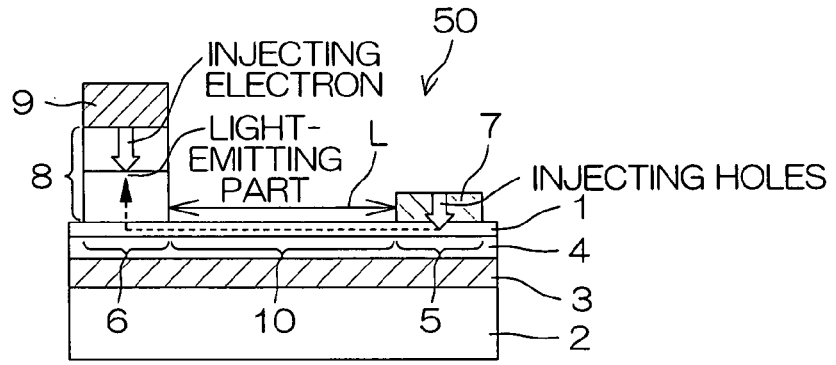
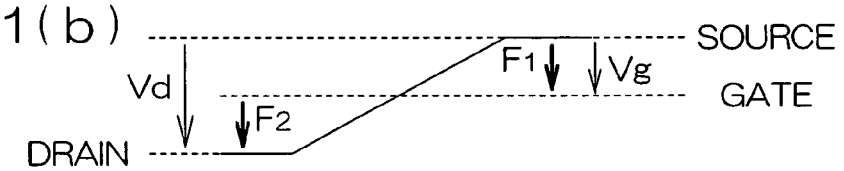
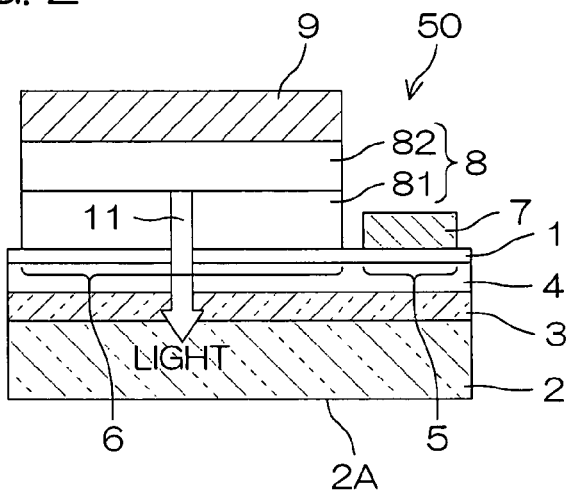

ORGANIC SEMICONDUCTOR LIGHT EMITTING DEVICE AND DISPLAY DEVICE USING THE SAME

TECHNICAL FIELD

The present invention relates to an organic semiconductor device that comprises an organic semiconductor light-emitting layer and a display using the same.

BACKGROUND ART

A device which is the combination of an organic semiconductor transistor and an organic semiconductor light-emitting element is seen in Patent Reference 1. This device comprises a semiconductor layer formed of P3HT, a source electrode and a drain electrode disposed apart from each other on one surface of the semiconductor layer, a gate electrode disposed on the other surface of the semiconductor layer through an insulating film, a light emitting layer formed of MEH-PPV laminated on the drain electrode, and a negative electrode laminated on the light emitting layer. The drain electrode also works as positive electrode of the light-emitting element.

With this arrangement, current flows from the source electrode to the drain electrode through the semiconductor layer. Furthermore, supply of this current to the light emitting layer allows the observation of light emission from the light emitting layer. Patent Reference 1: Japanese Unexamined Patent Publication No. 2002-512451 (paragraph 0029, FIG. 2)

DISCLOSURE OF THE INVENTION

Problem to be Solved by the Invention

In the arrangement of the prior art, a boundary of the light emitting layer with metal, and a boundary of metal with semiconductor layer are formed on the upper and lower sides of the drain electrode, respectively. To improve the light emitting efficiency by injecting carriers to the light emitting layer efficiently, it is important to avoid boundaries form being damaged as much as possible, and to lower contact resistance as much as possible.

Application of the sputtering method or the vacuum deposition method to form a drain electrode on the transistor side semiconductor layer, however, semiconductor layer is damaged. Furthermore, lamination of an organic layer of the light emitting layer on a metal layer makes adhesion properties insufficient, and electric resistance at the boundary will be high. It is thus difficult to achieve good electrical connection between the metal layer and the organic layer.

Moreover, since the drain electrode undertakes a roll for receiving carriers from the transistor side semiconductor layer and injecting the carriers to the light emitting layer, the material of the drain electrode must be selected to have a high carrier injection efficiency from semiconductor layer and a high carrier injection efficiency to the light emitting layer. Therefore, the drain electrode must be made of the material having work function which conforms to both the transistor side semiconductor layer and the light emitting layer, severely narrowing the range of selection.

An object of the present invention is to provide an organic semiconductor light-emitting device which is capable of enhancing carrier injection efficiency from an organic semiconductor active layer of a transistor to an organic semiconductor light emitting part, and a display using the same.

Means for Solving the Problem

In one aspect of the present invention, there is provided an organic semiconductor light-emitting device comprising an organic semiconductor active layer as a transistor active layer, having a source area and a drain area set at a interval of a predetermined channel length, a source electrode joined to the source area on the organic semiconductor active layer, an organic semiconductor light emitting part joined to the drain area on the organic semiconductor active layer, an drain electrode joined to the organic semiconductor light emitting part, and a gate electrode arranged in the organic semiconductor active layer to face to at least a region between the source area and the drain area with an insulating film sandwiched for controlling transportation of carriers between the source area and the drain area. The organic semiconductor light emitting part includes an organic semiconductor light-emitting layer which is supplied with either electrons or holes from the drain electrode and is supplied with the other ones of electrons or holes from the organic semiconductor active layer, thereby generating light due to recombination of electrons and holes.

According to the invention, the organic semiconductor light emitting part is joined to the organic semiconductor active layer as a transistor active layer, the boundary therebetween is a joined surface of organic materials, and there is no boundary of metal-organic semiconductor. The boundary between the organic semiconductor active layer and the organic semiconductor light emitting part thus is good boundary with less damage, and good adhesion properties are exhibited since it is organic-organic joint. This can enhance carrier injection efficiency from the organic semiconductor active layer to the organic semiconductor light emitting part, enabling light emitting operation with high efficiency. As a matter of course, there is no need to select an electrode material taking into account of both the organic semiconductor active layer and the organic semiconductor light emitting part.

The organic semiconductor light-emitting layer can comprise a hole transporting layer formed of an organic semiconductor material (P-type organic semiconductor material) which can transport holes, an electron transporting layer formed of an organic semiconductor material (N-type organic semiconductor material) which can transport electrons, and a light emitting layer formed of an organic semiconductor material and interposed between the hole transporting layer and the electron transporting layer. In this case, when a P-type organic semiconductor material is used for the organic semiconductor active layer, the hole transporting layer is joined to the organic semiconductor active layer in a drain area, and when an N-type organic semiconductor material is used for an organic semiconductor active layer, the electron transporting layer is joined to the organic semiconductor active layer in the drain area.

Furthermore, the organic semiconductor light-emitting layer can have a laminated structure which includes a hole transporting layer working as a light emitting layer and an electron transporting layer, or can have a laminated structure which includes a hole transporting layer and an electron transporting layer working as a light emitting layer.

The organic semiconductor active layer can be formed of a P-type organic semiconductor material, or can be formed of an N-type organic semiconductor material. Moreover, the organic semiconductor active layer can be formed of a bipolar organic semiconductor material which can transport both holes and electrons.

The P-type organic semiconductor material includes, for example, Pentacene, Tetracene, metal phthalocyanine (Copper phthalocyanine, etc.), Oligothiophene (α-Sexithiophene, α,ω-Dihexyl-sexithiophene), polythiophene (Poly(3-hexylthiophene), Poly(3-butylthiophene)), polyfluorene, Anthracene, Oligophenylene, Oligophenylenevinylene, Dihexyl-Anthradithiophene, Bis(dithienothiophene), Poly (phenylenevinylene), Poly(thienylenevinylene), Polyacetylene, α,ω-Dihexyl-quinquethiophene, TPD, α-NPD, m-MTDATA, TPAC, TCTA, Poly(vinylcarbazole), and so on.

The N-type organic semiconductor material includes, for example, perylene skeletal diimide($C_6$-PTC, $C_8$-PTC, $C_{12}$-PTC, $C_{13}$-PTC, Bu-PTC, $F_7$Bu-PTC*, Ph-PTC, $F_5$Ph-PTC*, PTCBI(3,4,9,10-perylene-tetracarboxylic-diimide), PTCDI (3,4,7,8-naphthalene-tetracarboxylic-diimide)), naphthalene skeletal diimide(PTCDI(3,4,7,8-naphthalene-tetracarboxylic-diimide), $C_6$-NTC, $C_8$-NTC, $C_{12}$-NTC and fluorinated alkyl substitute of these), fluorinated phthalocyanine, fluorinated pentacene, fluorinated oligothiophene, TCNQ, $C_{60}$fullerene, and so on.

Moreover, the bipolar organic semiconductor material includes, for example, α-NPD, $Alq_3$(Tris(8-hydroxyquinolinato)aluminum(III)), CBP(4,4'-Bis(carbazol-9-yl)biphenyl), BSA-1m(9,10-Bis(3-cyanostilil)anthracene), MEHPPV (Poly[2-Methoxy-5-(2-ethylhexyloxy)-1,4-phenylenevinylene]), CN-PPP(Poly[2-(6-cyano-6-methylheptyloxy)-1, 4-phenylene]), Bis(2-(2-hydroxyphenyl)-benz-1,3-thiazolato)zinc complex, Poly[(9,9-dihexylfluoren-2,7-diyl)-co-(anthracen-9,10-diyl)], and so on.

The organic semiconductor material which forms the light emitting layer of the organic semiconductor light emitting part includes, for example, metal complex system material exhibiting fluorescence such as $Alq_3$, material doped other fluorochrome such as DCM2, Rubrene, Coumarin, Perylene to the metal complex material, or material doped phosphorescence emitting colorant such as fac-tris(2-phenypyridine) iridium(Ir(ppy)$_3$) to 4,4'-Bis(carbazol-9-yl)biphenyl(CBP).

Furthermore, the hole transporting material includes, for example, diamine system material such as α-NPD and TPD, and m-TDATA, etc.

The gate electrode may be arranged on the opposite side of the source electrode and the organic semiconductor light emitting part with respect to the organic semiconductor active layer, and at the same time extends to a region opposing to the source area and the drain area.

With this arrangement, the gate electrode can control carrier movement, between the source and the drain, can form an electric field, between the gate electrode and the source electrode, for injecting carriers from the source electrode to the organic semiconductor active layer and can form an electric field, between the gate electrode and the drain electrode, for injecting carriers from the drain area to the organic semiconductor light emitting part as well as for injecting carriers from the drain electrode to the organic semiconductor light emitting part. This further enhances carrier injection efficiency to the organic semiconductor light emitting part, dedicating to high efficient light emission.

In addition, the gate electrode can comprise a first gate electrode which is arranged to face to the source area, and a second gate electrode which is electrically independent from the first gate electrode and arranged to face to the drain area.

With this arrangement, the gate electrode is divided into the first gate electrode on the source area side and the second gate electrode on the drain area side, and control voltages can be individually applied to these electrodes. Therefore, carrier injection from the source electrode to the organic semiconductor active layer and carrier injection from the drain area and the drain electrode to the organic semiconductor light emitting part can be individually controlled. This enables setting of appropriate carrier injection balance, so that light emission with higher efficiency can be realized.

It is preferable that the space between the first and second gate electrode is set to be shorter than the channel length.

Either of the source area or the drain area can comprise a pair of regions set on both sides of the other one of the source area or the drain area.

Distribution of carrier injection from the drain area of the organic semiconductor active layer to the organic semiconductor light emitting part is biased to the source area side. Thus, adoption of the aforementioned arrangement can ensure larger dimension of light emission.

Either the source area or the drain area is preferably set to surround the other one of the source area or the drain area on at least three sides. With this arrangement, further larger dimension of light emission can be ensured. As a matter of course, an arrangement where either source area or the drain area is surrounded by another area from four sides is possible. Furthermore, an arrangement where almost all the circumference of either the source area or the drain area is surrounded by the other area can be adopted.

The organic semiconductor light-emitting device can further comprise a carrier dispersion film interposed between the drain area and the insulating film, for dispersing carriers. With this arrangement, since the carrier dispersion film makes it possible to distribute carriers to wide region of the drain area, carriers are injected to the organic semiconductor light emitting part in the wide area of the drain area. This can realize larger dimension of light emission.

At least either the gate electrode or the drain electrode may include a transparent electrode layer. In this case, it is preferable to provide a diffraction member adjacent to the transparent electrode layer, for diffracting light which travels in the transparent electrode layer toward the normal line direction of the transparent electrode layer. With this arrangement, since light concentrating on the transparent electrode layer with high refractive index can be extracted toward the normal line direction of the transparent electrode layer, light extracting efficiency can be enhanced, implementing a light emission device with higher luminance.

A display in the present invention can be constructed by arranging a plurality of organic semiconductor light-emitting devices as described above on a substrate. A one-dimensional or two-dimensional display, of which each image is composed of organic semiconductor light-emitting devices, can be constructed by arranging such organic semiconductor light-emitting devices one-dimensionally or two-dimensionally on a substrate.

The above and other objects, characteristics, and advantages of the present invention will be made clear by the following description of the embodiments made in reference to the attached drawings.

BRIEF DESCRIPTION OF THE DRAWINGS

FIGS. 1(a) and 1(b) are diagrams for describing an arrangement and an operation of an organic semiconductor light-emitting device according to one embodiment of the present invention.

FIG. 2 is a schematic sectional view for describing more specific arrangement of the organic semiconductor light-emitting device in FIG. 1.

MODE FOR CARRYING OUT THE INVENTION

Figure 3:
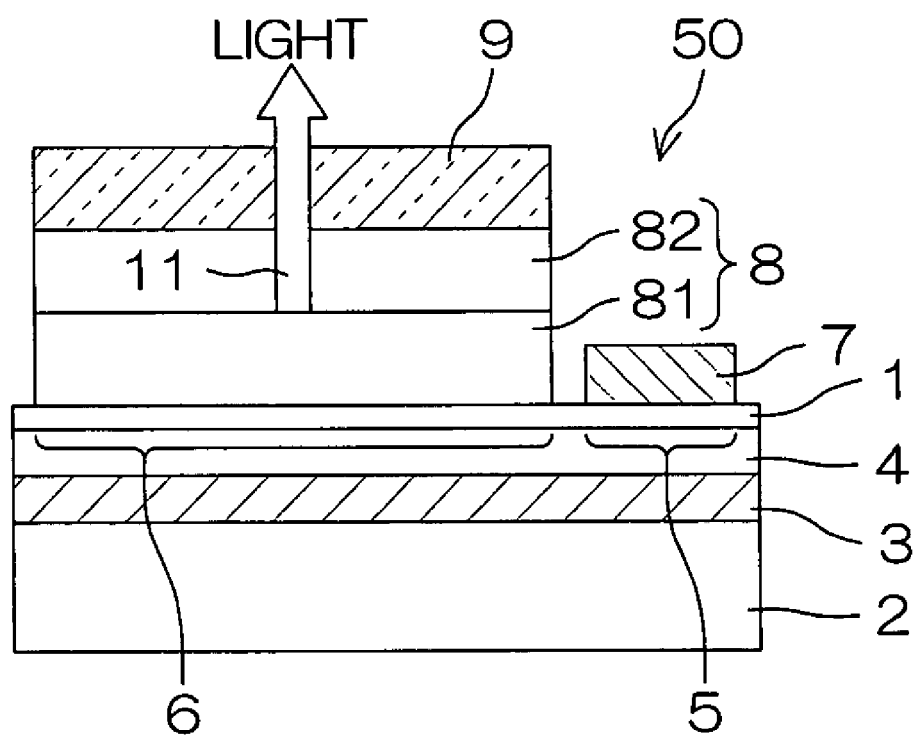
FIG. 3 is a schematic sectional view for showing an arrangement to extract light to the opposite side of a substrate.

FIG. 1(a) is a schematic sectional view for describing an arrangement of an organic semiconductor light-emitting device according to one embodiment of the present invention. This organic semiconductor light-emitting device 50 has the basic structure of a field-effect transistor with an organic semiconductor active layer 1 as a transistor active layer. More specifically, the organic semiconductor light-emitting device 50 comprises a substrate 2, a gate electrode 3 formed on the substrate 2, a gate insulating film 4 laminated on the gate electrode 3, and the aforementioned organic semiconductor active layer 1 laminated on the gate insulating film 4. On the organic semiconductor active layer 1, a source area 5 and a drain area 6 are disposed with space of a predetermined channel length L from each other. A lamination structure of a source electrode 7 is formed on the source area 5, and an organic semiconductor light emitting part 8 formed of an organic semiconductor material is laminated on the drain area 6. A drain electrode 9 is formed by lamination on the organic semiconductor light emitting part. In other words, this organic semiconductor light-emitting device 50 has the basic structure of a field-effect transistor (TFT: thin-film field-effect transistor), with organic semiconductor light emitting part 8 interposed between the organic semiconductor active layer 1 and the drain electrode 9.

The gate electrode 3 faces, via the gate insulating film 4, to a channel area 10 between the source area 5 and the drain area 6, while extending to an area directly below the source area 5 and the drain area 6. In other words, the gate electrode 3 faces to the source area 5 through the gate insulating film 4, and faces to the drain area 6 through the gate insulating film 4 at the same time. This generates an electric field between the gate electrode 3 and the source electrode 7, allowing efficient injection of carriers (either holes or electrons) from the source electrode 7 to the organic semiconductor active layer 1. Moreover, the electric field generated between the gate electrode 3 and the drain electrode 9 allows carriers (either holes or electrons) of one polarity to be injected from the organic semiconductor active layer 1 to the organic semiconductor light emitting part 8 efficiently, and allows carriers (the other ones of holes or electrons) of the other polarity to be injected from the drain electrode 9 to the organic semiconductor light emitting part 8 efficiently. This can generate recombination of holes and electrons in the organic semiconductor light emitting part 8 efficiently, achieving highly efficient light emission.

For example, the case where the organic semiconductor active layer 1 is formed of a P-type organic semiconductor material which can transport holes is considered. In this case, potentials shown in FIG. 1(b) are respectively applied to the gate electrode 3, the source electrode 7, and the drain electrode 9. In other words, voltage Vg (<0) is applied to the gate electrode 3 with the source electrode 7 as a reference, and voltage Vd (<0) is applied to the drain electrode 9 with the source electrode 7 as a reference. This forms an electric field F1 directing from the source electrode 7 to the gate electrode 3 between the gate electrode 3 and the source electrode 7, and an electric field F2 directing from the gate electrode 3 to the drain electrode 9 between the gate electrode 3 and the drain electrode 9. Accordingly, the electric field F1 injects holes from the source electrode 7 to the organic semiconductor active layer 1. Furthermore, the electric field F2 injects holes from the gate electrode 3 to the organic semiconductor light emitting part 8, while electrons are injected from the drain electrode 9 to the organic semiconductor light emitting part 8.

Holes injected from the source electrode 7 to the organic semiconductor active layer 1 are transported from the source area 5 to the drain area 6 through the organic semiconductor active layer 1, and then are injected from the drain area 6 to the organic semiconductor light emitting part 8. The amount of transported holes from the source area 5 to the drain area 6 can be controlled by voltage Vg applied to the gate electrode 3. This can control on/off of light emission by conducting/blocking the area between the source area 5 and the drain area 6. In addition, by applying a voltage Vg that varies in a stepwise or continuous manner to the gate electrode 3, the amount of transported holes from the source area 5 to the drain area 6 can be changed in a stepwise or continuous manner, and the amount of light emission thus can be changed in a stepwise or continuous manner. That is, amount of light emission can be modulated.

FIG. 2 is a schematic sectional view for describing more specific arrangement of the organic semiconductor light-emitting device 50 in FIG. 1(a). The organic semiconductor light-emitting device 50 shown in FIG. 2 has an arrangement for extracting light 11 to the substrate 2 side. Specifically, the substrate 2 is formed of a transparent substrate such as glass substrate, the gate electrode 3 is formed of a transparent electrode film constituted of a transparent conductive material such as ITO (indium tin oxide), IZO (indium zinc oxide), or ZnO (zinc oxide), and the gate insulating film 4 is formed of a transparent insulating film such as silicon oxide film. The organic semiconductor active layer 1 is formed of, for example, pentacene which is a P-type organic semiconductor material. The source electrode 7 is constructed by a metal material such as gold which can easily inject holes to the organic semiconductor active layer 1.

The organic semiconductor light emitting part 8 comprises a organic semiconductor laminate film having a hole transporting layer 81 disposed in contact with the organic semiconductor active layer 1 and an electron transporting layer 82 which works as a light emitting layer and is laminated on the hole transporting layer 81. The hole transporting layer 81 is formed of a material which can transport holes, in other words, can inject holes and is formed of the aforementioned P-type organic semiconductor material which can transport holes therein. Moreover, the electron transporting layer 82 is formed of the aforementioned N-type organic semiconductor material which can transport electrons therein and inject electrons.

On the electron transporting layer 82, the drain electrode 9 which is a metal electrode is laminated. The drain electrode 9 is formed of a metal material which can easily inject electrons to the electron transporting layer 82, specifically including, for example, MgAg, Al, Al/Li, and Ca.

In the organic semiconductor light-emitting device with such arrangement, light emission generates in a region near the boundary between the electron transporting layer 82 and the hole transporting layer 81, and the generated light 11 is extracted to the transparent substrate 2 side.

FIG. 3 is a schematic sectional view for showing an arrangement to extract the light 11 to the opposite side of a substrate. In FIG. 3, portions corresponding to the respective portions shown in FIG. 2 are provided with the same reference numerals as those of FIG. 2. With the arrangement in FIG. 3, the gate electrode 3 is formed of a metal material such as Al, and the substrate 2 is formed of silicon, for example. The gate insulating film 4 is not necessary to be transparent, but for example, is formed of silicon oxide. When the substrate 2 is constructed by a semiconductor material such as silicon, the gate electrode 3 can be formed of a conductive layer constructed by an impurity diffusion layer formed on the surface part of the substrate 2.

The organic semiconductor active layer 1 is formed of pentacene, for example, which is a P-type organic semiconductor material similarly to the arrangement in FIG. 2, and the source electrode 7 which is formed in contact with the source area 5 is a metal electrode formed of gold, for example. The arrangement of the organic semiconductor light emitting part 8 is similar to the one in FIG. 2. The drain electrode 9 which is laminated on the electron transporting layer 82 is formed of a transparent electrode film in this embodiment. The transparent electrode film can be formed of ITO, IZO, or ZnO, for example.

With this arrangement, light emission generated in the region near the boundary between the electron transporting layer 82 and the hole transporting layer 81 in the electron transporting layer 82 due to recombination of holes and electrons is observed on the side of the drain electrode 9 formed of a transparent electrode film.

Figure 4A:
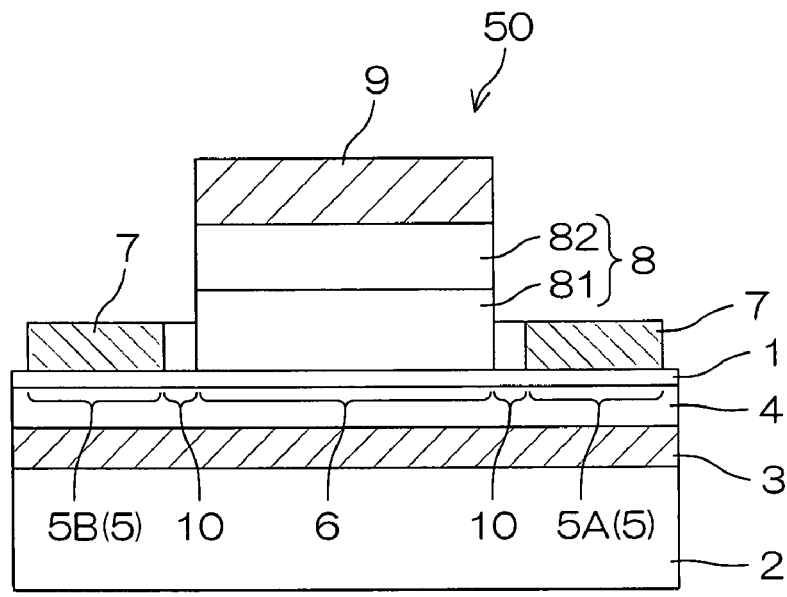
FIG. 4(a) and FIG. 4(b) are diagrams showing further another specific arrangement of the organic semiconductor light-emitting device.
Figure 4B:
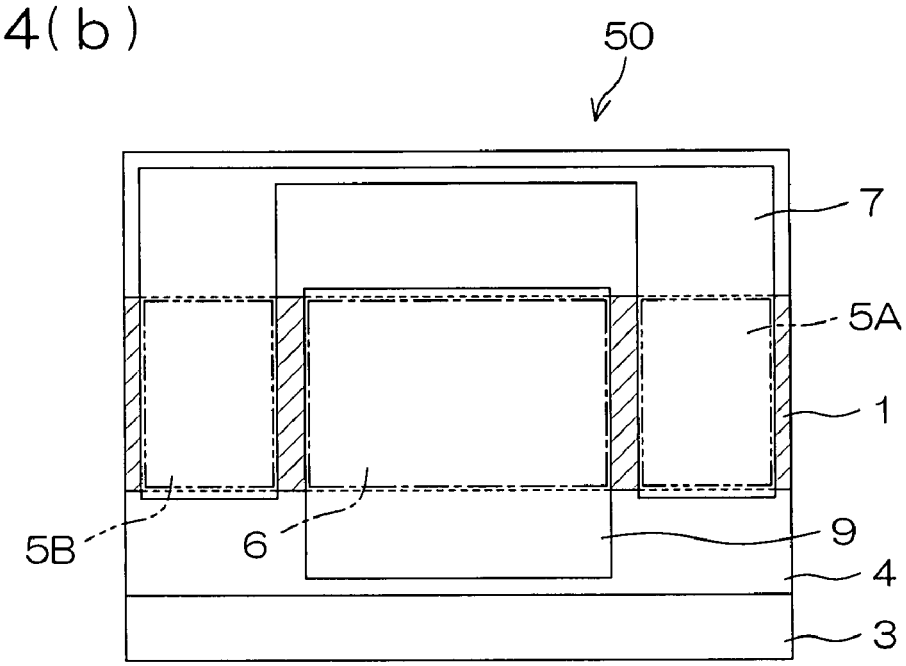

FIG. 4(a) and FIG. 4(b) are diagrams showing further another specific arrangement of the organic semiconductor light-emitting device 50. FIG. 4(a) is a schematic sectional view and FIG. 4(b) is a schematic plan view of the arrangement. In this arrangement, a source area 5 of an organic semiconductor active layer 1 (the region with diagonal lines which is not hidden by a source electrode 7 or a drain electrode 9 in FIG. 4(b) has a pair of areas 5A, 5B set on the both sides in respect to a predetermined direction of a drain area 6 where a laminated structure of an organic semiconductor light emitting part 8 and a drain electrode 9 is formed. To be commonly joined onto these areas 5A, 5B, a source electrode 7 formed of a metal electrode is formed in generally U shape in a plan view. In the embodiment, the organic semiconductor active layer 1 is formed in band pattern which goes from one area 5A of the source area 5 through the drain area 6 to the other area 5B. In other words, the source electrode 7 is in contact with the organic semiconductor active layer 1 in the areas 5A, 5B, but is in contact with a gate insulating film 4 in other regions.

In the arrangement of FIG. 2 or FIG. 3, since holes are transported from one side to the drain area 6, the location of light emission is concentrated on the source area 5 side, and it is difficult to keep large dimension of light emission as a result. In the arrangement shown in FIG. 4(a) and FIG. 4(b), the source areas 5A, 5B are disposed on the both sides of the drain area 6 respectively, so that holes are transported from the opposite two directions to the drain area 6. This enables light emission in the large area of the organic semiconductor light emitting part 8, increasing the dimension of light emission.

In FIG. 4(b), the reason why the gate electrode 3 is exposed in the region of the lower side of the diagram is to provide the gate electrode 3 with a contact for external connection, and as a matter of course, the contact for external connection also can be provided by another arrangement.

Figure 5:
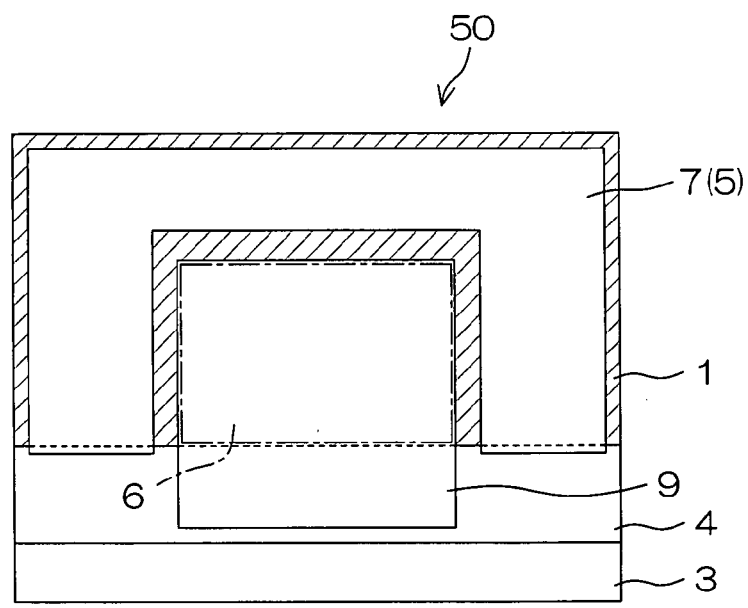
FIG. 5 is a plan view for describing an alternative of the arrangement in FIG. 4.

FIG. 5 is a plan view for describing an alternative of the arrangement in FIG. 4(a) and FIG. 4(b). In the arrangement shown in FIG. 5, a source area 5 is provided so as to surround a rectangular drain area 6 in U shape in plan view, and then a similar U shape source electrode 7 is laminated on the source area 5. In the arrangement, the source area 5 surrounds the drain area 6 on three sides (three directions defined by 90 degree space in a plane which is parallel with the organic semiconductor active layer 1), so that the dimension of light emission in the organic semiconductor light emitting part 8 can be increased.

Figure 6:
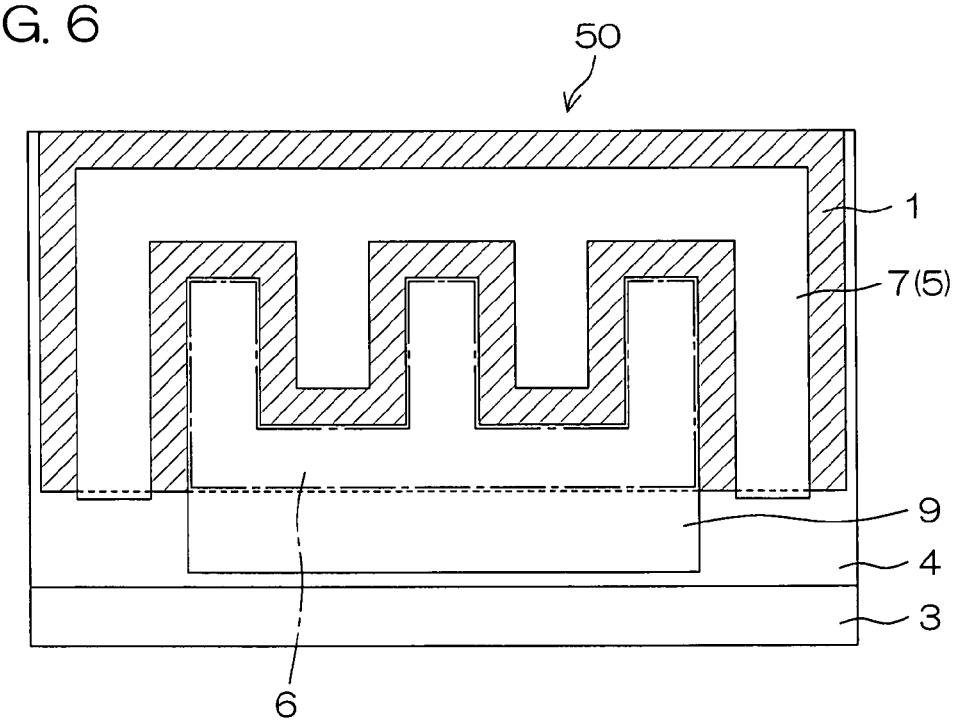
FIG. 6 is a schematic plan view for describing another alternative arrangement.

FIG. 6 is a schematic plan view for describing further another alternative arrangement. In the arrangement, a source area 5 and a drain area 6 are respectively formed in comb shape which engage with each other. In according to this, a source electrode 7 is formed in comb shape with the same pattern as the comb shape of the source area 5, while the laminated structure of an organic semiconductor light emitting part 8 and a drain electrode 9 have identical comb shape pattern with the comb shape of the drain area 6.

With this arrangement, the whole length of the opposing part (channel width) of the source area 5 and the drain area 6 can be made long, while the dimension of light emission can be increased.

Figure 7:
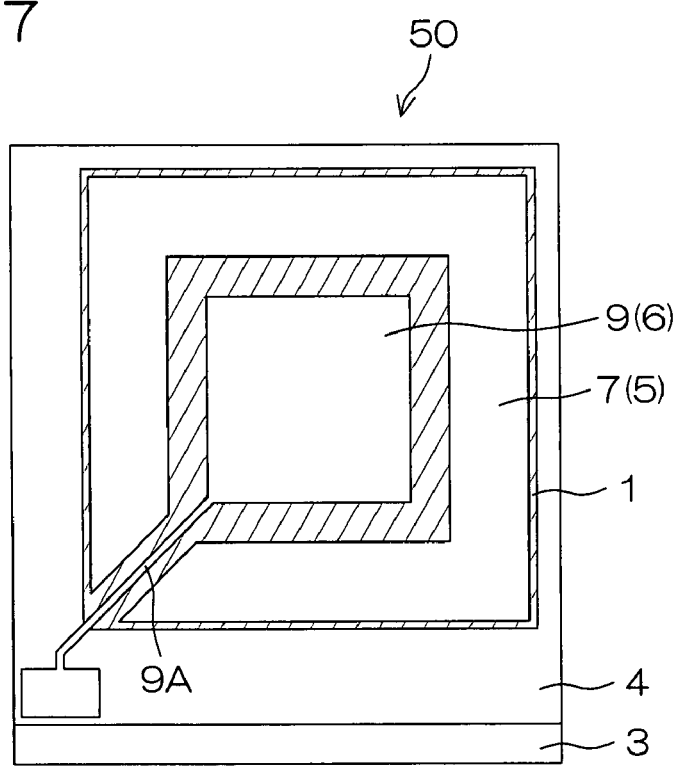
FIG. 7 is a schematic plan view for describing further another alternative arrangement.

FIG. 7 is a schematic plan view for describing further another alternative arrangement. In this arrangement, a drain area 6 is formed in rectangular (almost square), while an organic semiconductor light emitting part 8 and a drain electrode 9 are formed in rectangular. From one corner of the rectangular drain electrode 9, a lead 9A is drawn. A source area 5 is set to generally surround the drain area 6 on four sides (four directions defined by space at an interval of 90 degree in a plane which is parallel with an organic semiconductor active layer 1) while the lead 9A is not included, and the source electrode 7 is formed on the source area 5 configured by the rectangular surrounded area. With this arrangement, holes can be supplied to the drain area 6 from almost all directions of its circumference, so that the dimension of light emission can be further increased.

Figure 8:
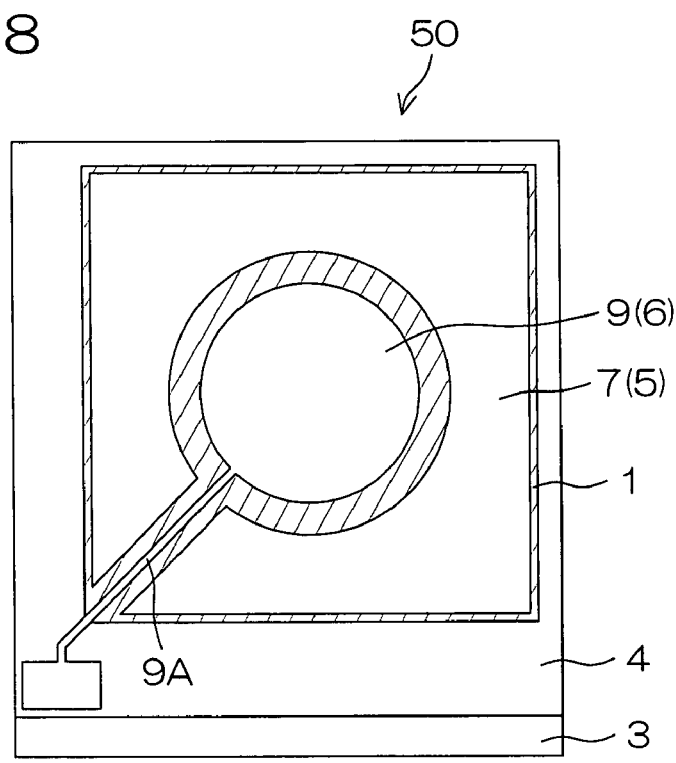
FIG. 8 is a schematic plan view for describing further another alternative arrangement.

FIG. 8 is a schematic plan view for describing further another alternative arrangement. In the arrangement, a drain area 6 is set in circular shape, and a circular organic semiconductor light emitting part 8 and a drain electrode 9 are laminated on the circular drain area 6. Furthermore, a lead 9A is drawn from the circular drain electrode 9 in single direction.

On the other hand, a source area 5 is formed so as to be circularly surrounding on almost all sides of the circular drain area 6, while the lead 9A is not included. A source electrode 7 with the same pattern is laminated on the circular source area 5. With this arrangement, holes also can be supplied to the almost all circumference of the drain area 6, so that large dimension of light emission can be obtained.

In the arrangements in FIG. 4 to FIG. 8, the location of the source area 5 and the drain area 6 can be reversed. In other words, in the arrangement in FIG. 4(*a*) and 4(*b*), the drain area 6 can be dispersedly disposed on both sides of the source area 5, and in the arrangement in FIG. 5, the drain area 6 can be set in U shape so as to surround the source area 5 on three sides. In addition, in the arrangements in FIG. 7 and FIG. 8, the source area 5 can be positioned at the center and the drain area 6 can be disposed so as to surround the source area 5 on approximately whole circumference.

Figure 9:
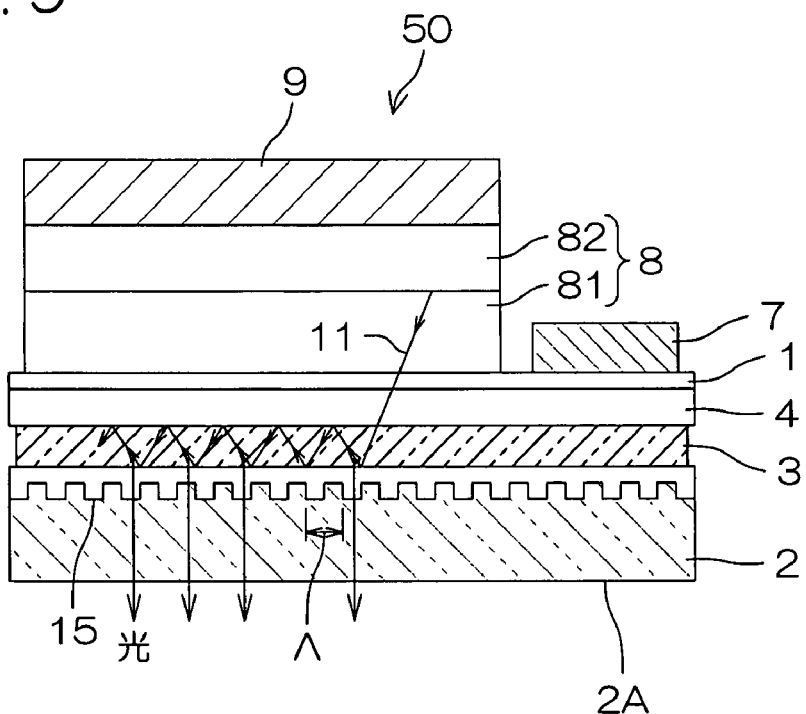
FIG. 9 is a schematic sectional view showing an alternative arrangement of organic semiconductor light-emitting device shown in FIG. 2.

FIG. 9 is a schematic sectional view showing an alternative arrangement of the organic semiconductor light-emitting device 50 shown in FIG. 2.

In the arrangement, a diffraction gating 15 which is a diffracting member is disposed on the transparent substrate 2 side near the boundary between a gate electrode 3 formed of a transparent electrode film and the transparent substrate 2. The diffraction gating 15 diffracts light 11 propagating toward a end surface 16 of the substrate 2 in the gate electrode 3 formed of the transparent electrode film to a surface 2A side of the transparent substrate 2 (that is, the normal line direction of the gate electrode 3).

The transparent electrode film formed of such as ITO typically has a refractive index n: around 2, that is the highest refractive index among a gate insulating film 4 (e.g., refractive index n=1.5) formed of a silicon oxide film, etc., a transparent substrate 2 (e.g., refractive index n=1.5) formed of glass substrate, etc., an organic semiconductor active layer 1 (e.g., refractive index n=1.7 to 1.8), a hole transporting layer 81 (e.g., refractive index n=1.7), and an electron transporting layer 82 (e.g., refractive index n=1.7). Thus, light generated in the organic semiconductor light emitting part 8 has tendency to be locked in the gate electrode 3 formed of the transparent electrode film.

Accordingly, by arranging the diffraction gating 15 on the transparent substrate 2 side which is light extracting direction for the gate electrode 3 formed of the transparent electrode film, light 11 propagating in the gate electrode 3 can be efficiently extracted to the surface 2A side of the transparent substrate. Accordingly, an organic semiconductor light-emitting device having enhanced light extraction efficiency can be realized.

It is preferable that a diffraction gating cycle A is set to meet a relation to a light wavelength generating in the organic semiconductor light emitting part 8, wherein $A=k\lambda$ ($k=1, 2, 3, \ldots$). This enables more efficient light extracting.

Figure 10:
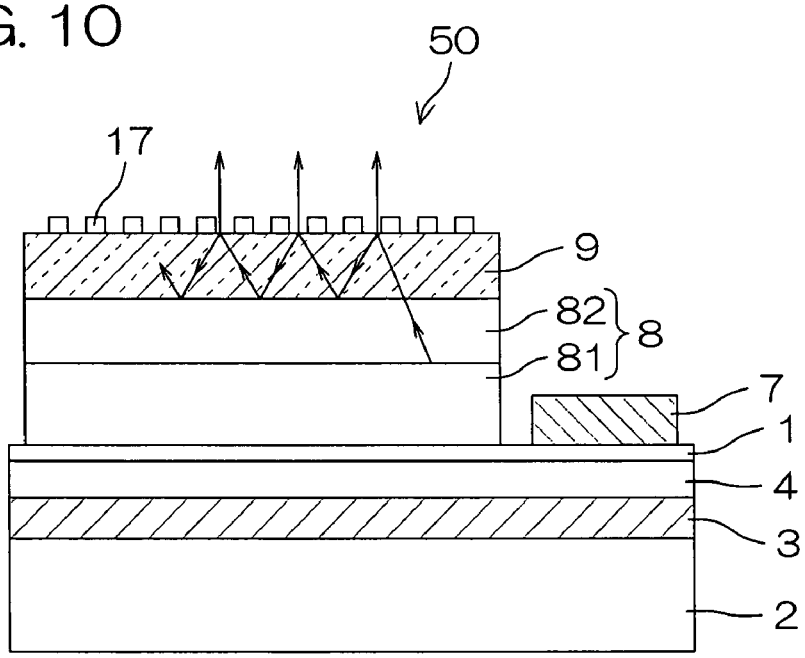
FIG. 10 is a diagram showing an arrangement of the organic semiconductor light-emitting device in FIG. 3 which is altered similarly to the one in FIG. 9.

FIG. 10 is a diagram showing an arrangement of the organic semiconductor light-emitting device 50 in FIG. 3 which is altered similarly in FIG. 9. In this arrangement, a diffraction gating 17 is formed on the surface of a drain electrode 9 formed of a transparent electrode film. In the arrangement of FIG. 3, light has a tendency to be locked in the drain electrode 9 formed of the transparent electrode film, and light 11 propagating in the drain electrode 9 can be extracted outside in the normal line direction of the drain electrode 9 by the diffraction gating 17. This can improve light extraction efficiency.

In stead of the diffraction gating 15, 17, microdots can be arranged in distributed manner to form a diffracting member for diffracting light 11 propagating in the gate electrode 3 or the drain electrode 9 toward radial directions of those to extract the light. For example, in the arrangement of FIG. 9, by printing microdots on the surface of the glass substrate 2, and then coating the surface of the glass substrate 2 with glass, the glass substrate 2 embedded with the aforementioned diffracting member can be obtained. When the diffraction gating 15 is formed in the glass substrate 2, for example, stripe pattern of the diffraction gating is formed by printing, etc. on the surface of the glass substrate 2, and then, glass coating may be applied on the pattern.

In the arrangement of FIG. 10, to form a diffraction gating 17 or a diffusion pattern which is formed of the microdot diffusion pattern described above on the surface of a drain electrode 9, stripe pattern of the diffraction gating or diffusion dot pattern may be printed on the surface of the drain electrode 9.

Figure 11:
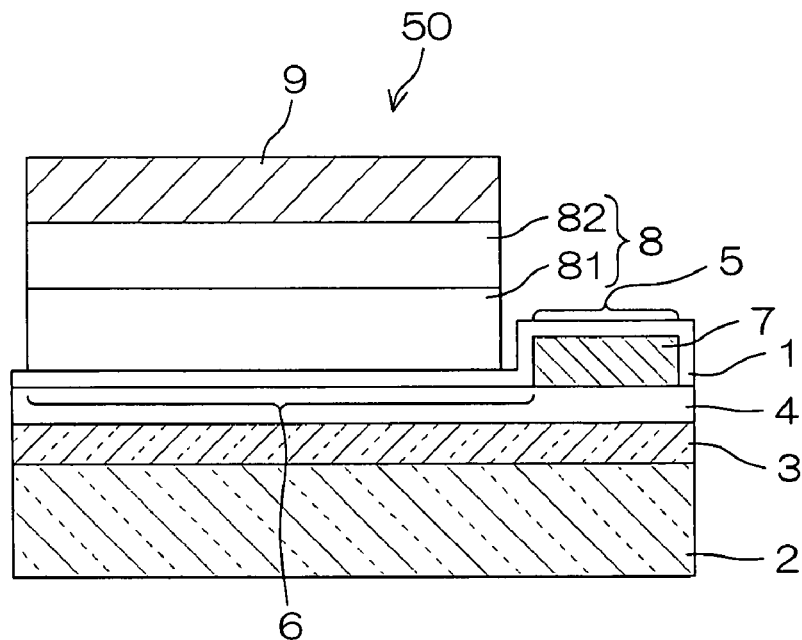
FIG. 11 is a schematic sectional view showing further another alternative arrangement of the arrangement shown in FIG. 2.

FIG. 11 is a schematic sectional view showing further another alternative of the arrangement shown in FIG. 2. In the arrangement, a source electrode 7 is formed on a gate insulating film 4 in contact, and an organic semiconductor active layer 1 is formed so as to cover the source electrode 7. In other words, the source electrode 7 has a so-called bottom contact type configuration. With this arrangement, an operation which is similar to the arrangement in FIG. 2 is also possible.

As a matter of course, in any arrangements shown in FIG. 3 to FIG. 10, similar alteration is possible.

Figure 12:
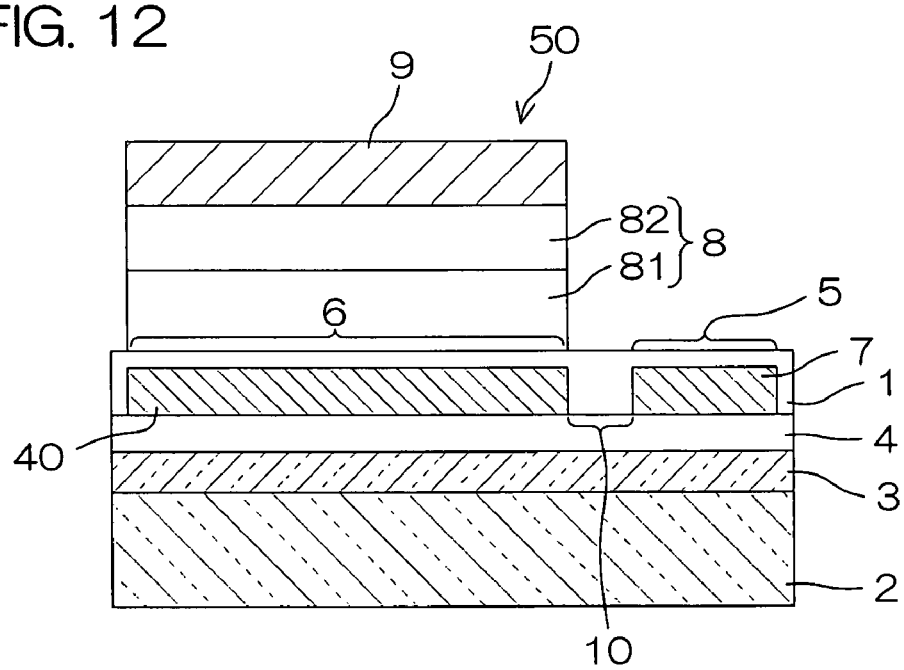
FIG. 12 is a schematic sectional view showing an arrangement according to further another alternative arrangement.

FIG. 12 is a schematic sectional view showing an arrangement regarding further another alternative. In the arrangement, a source electrode 7 formed of a metal electrode is laminated on a source area 5 and in contact with a gate insulating film 4, while a current dispersion film 40 as a carrier dispersion film in contact with gate insulating film 4 is laminated on a drain area 6. The organic semiconductor active layer 1 contacts the gate insulating film 4 in a channel area 10 between the source electrode 7 and the current dispersion film 40, covering the upper surface of the source electrode 7, furthermore, covering the upper surface of the current dispersion film 40. The drain area 6 is positioned at the upper region of the current dispersion film 40 in the organic semiconductor active layer 1, and on the drain area 6, the organic semiconductor light emitting part 8 and the drain electrode 9 are laminated.

With this arrangement, holes led from the source electrode 7 to the drain area 6 through the organic semiconductor active layer 1 are dispersed by the current dispersion film 40, and then are injected to the organic semiconductor light emitting part 8. This can generate recombination of holes and electrons in large dimension in the organic semiconductor light emitting part, so that the dimension of light emission can be increased.

As described above, according to the arrangement of the embodiment, in the drain area 6, the hole transporting layer 81 which is the organic semiconductor layer is laminated on the surface of the organic semiconductor active layer 1. Therefore, since there is no need to form a metal film on the surface of the organic semiconductor active layer 1 in the drain area 6, the organic semiconductor active layer 1 in the drain area 6 is not affected by damage, for example, which is caused in forming a metal film by the sputtering method. Additionally, the hole transporting layer 81 formed of an organic semiconductor material like the organic semiconductor active layer 1 can be laminated on the organic semiconductor active layer 1 with good adhesion properties. The contact resistance between the organic semiconductor active layer 1 and the organic semiconductor light emitting part 8, accordingly, is low, so that carriers are efficiently injected from the organic semiconductor active layer 1 to the organic semiconductor light emitting part 8. Insertion of an appropriate buffer layer between the organic semiconductor light-emitting layer 1 and the organic semiconductor light emission part 8 can further enhance injection efficiency.

In the source area 5, the source electrode 7 formed of the metal material is in contact with the organic semiconductor active layer 1, but the condition of the boundary between the source area 5 and the source electrode 7 does not significantly affect light emission in the organic semiconductor light emitting part 8 arranged at the drain area 6 side. Therefore, the source electrode 7 can be laminated on the organic semiconductor active layer 1 by, for example, the sputtering method without problem.

The drain electrode 9 is laminated on the organic semiconductor light emitting part 8, but for example, interposing of an appropriate buffer layer either in between the organic semiconductor light emitting part 8 and the drain electrode 9, or in between the organic semiconductor active layer 1 and the organic semiconductor light emitting part 8 can enhance carrier injection efficiency from the drain electrode 9 to the organic semiconductor light emitting part 8. In this case, the buffer layer enhances carrier injection efficiency by loosening the energy barrier between the drain electrode 9 and the organic semiconductor light emitting part 8. Specifically, the buffer layer can comprise Copper phthalocyanine (CuPc), m-MTDATA, PEDOT/PSS, Polyaniline, etc., in the case of holes injection, and a layer of electrons transportable organic semiconductor such as Tris(8-hydroxyquinoline)aluminum (III) ($Alq_3$), 4,7-Dipenil-1,10-phenanthroline(Bathophenanthroline), which is doped alkali metal such as lithium(Li), cesium(Cs), alkali metal/alkaline earth metal fluoride including lithium fluoride (LiF), germanium oxide($GeO_2$), aluminum oxide ($Al_2O_3$) and so on, in the case of electrons injection.

Figure 13:
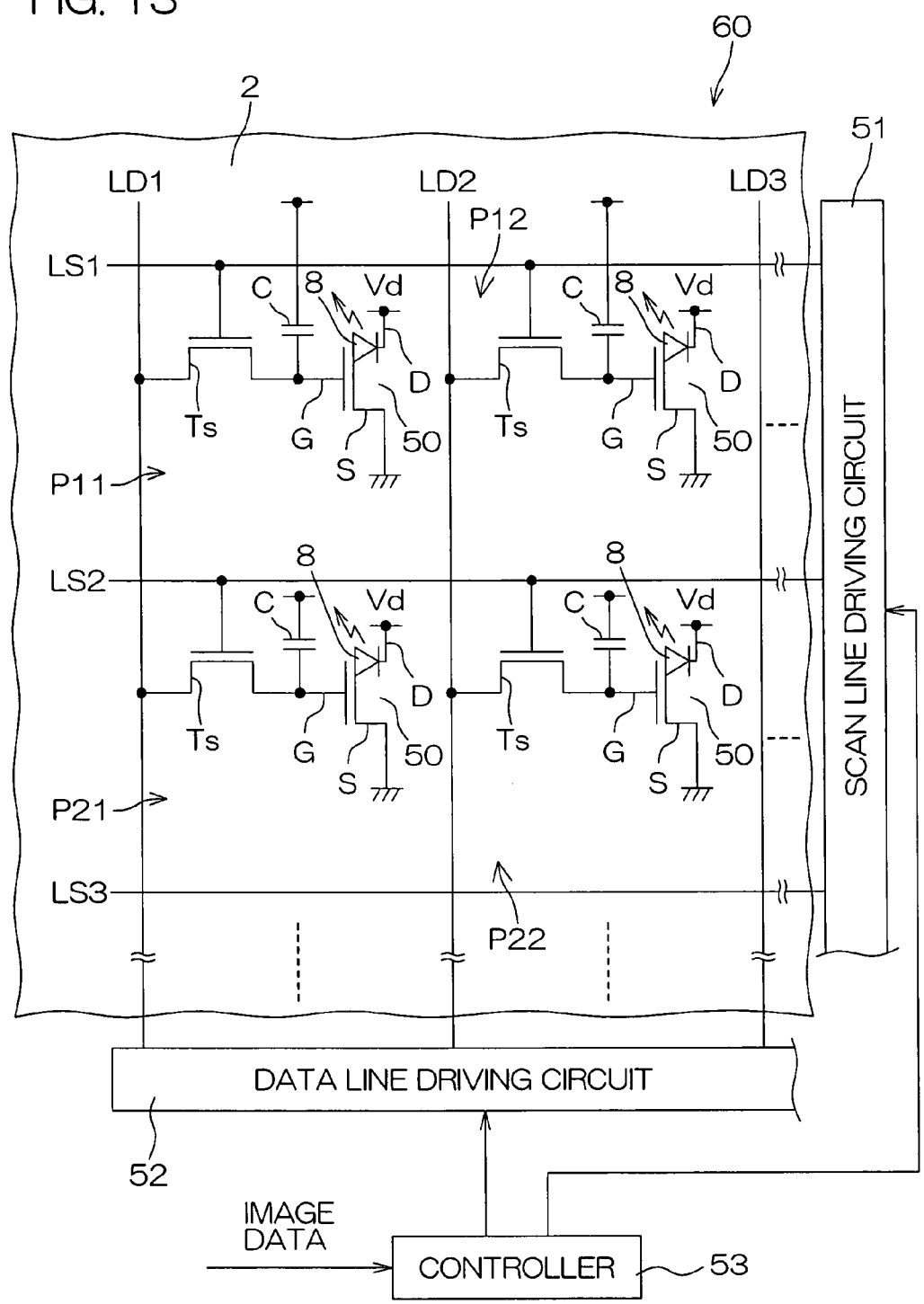
FIG. 13 is an electric circuit diagram of a display configured by two-dimensionally arranging organic semiconductor light-emitting devices with the arrangement shown in any one from FIG. 1 to FIG. 12 on a substrate.

FIG. 13 is an electric circuit diagram of a display 60 configured by two-dimensionally arranging organic semiconductor light-emitting devices 50 with the arrangement shown in any one from FIG. 1 to FIG. 12 on a substrate 2. In other words, the display device 60 has the aforementioned organic semiconductor light-emitting devices 50 respectively arranged in matrix-arrayed pixels P11, P12, . . . , P21, P22, . . . , and makes it possible to achieve two-dimensional display by selecting the organic semiconductor light-emitting devices 50 that are to emit light in these pixels and by controlling light intensity (luminance) of the organic semiconductor light-emitting devices 50 in these respective pixels.

Each organic semiconductor light-emitting device 50 is a P-channel type field-effect transistor(FET) which is integrally formed with the organic semiconductor light emitting part 8, of which a drain electrode 9(D) is supplied with bias voltage Vd (<0), and of which a source electrode 7(S) is set at ground potential (=0). To the gate electrode 3(G), a selective transistor $T_s$ for selecting each pixel and a capacitor C for preserving data are connected in parallel.

The pixels P11, P12, . . . ; P21, P22 . . . are aligned in rows. In these pixels, the selective transistors $T_s$ in each line have gates respectively connected as a group to their common scanning lines LS1, LS2, . . . . The pixels P11, P21 . . . ; P12, P22 . . . are aligned in columns. In these pixels, on the opposite side of the organic semiconductor light-emitting device 50, the selective transistors $T_s$ have gates connected respectively to their common data lines LD1, LD2, etc.

To scanning lines LS1, LS2, . . . , a scan drive signal is given from a scanning line driving circuit 51 that is controlled by a controller 53. The signal circulates pixels P11, P12, . . . ; P21, P22 . . . in each row and sequentially selects a plurality of pixels in a row collectively. More specifically, the scanning line driving circuit 51 sequentially scans each line and determines which line to be conducted or blocked and generates scan drive signal. With the signal, the selective transistors $T_s$ in a plurality of pixels in a selected line are made conductive. The selective transistors $T_s$ in a plurality of pixels in a non-selected line are blocked.

On the other hand, to data lines LD1, LD2, . . . , a signal is input from a data line driving circuit 52. To the data line driving circuit 52, a control signal corresponding to image data is input from the controller 53. The data line driving circuit 52 transmits a light emission control signal corresponding to gradation of light of each pixel in the selected line to the data lines LD1, LD2, . . . , in parallel, at the time when the scanning line driving circuit 51 selects a plurality of pixels in each line collectively.

Consequently, in each pixel of the selected line, a light emission control signal is transferred to the gate electrode 3(G) through the selective transistor $T_s$, allowing the organic semiconductor light-emitting device 50 of the selected pixel to emit light (or distinguish light) at gradation in accordance with the light emission control signal. Since the light emission control signal is preserved at a capacitor C, the electric potential of the gate electrode G is preserved even after the line selected by the scanning line driving circuit 61 moves to other line, thus preserving the lighting state of the organic semiconductor light-emitting device 50. In this manner, two-dimensional display is enabled.

Figure 14:
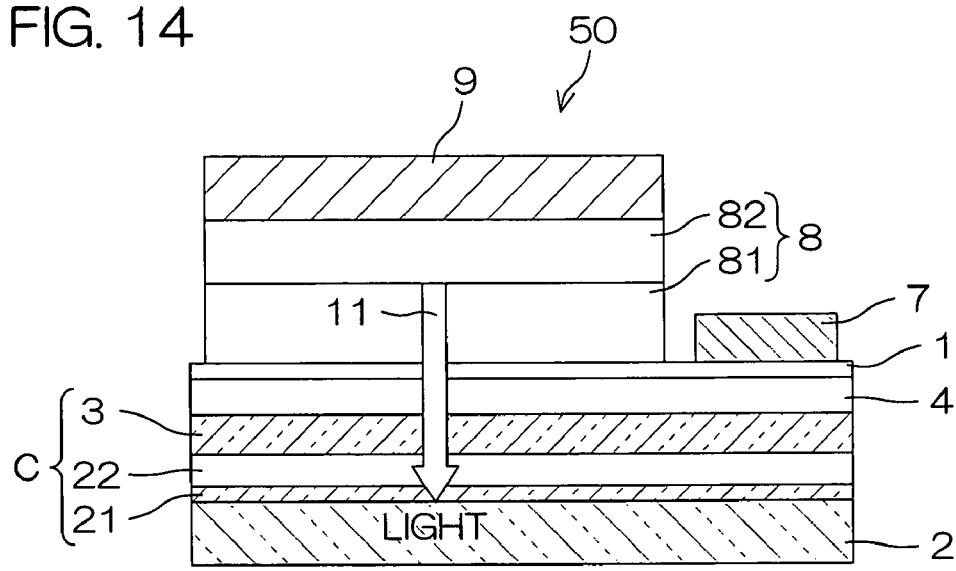
FIG. 14 is a schematic sectional view for describing an arrangement of a capacitor which corresponds to FIG. 2.
Figure 15:
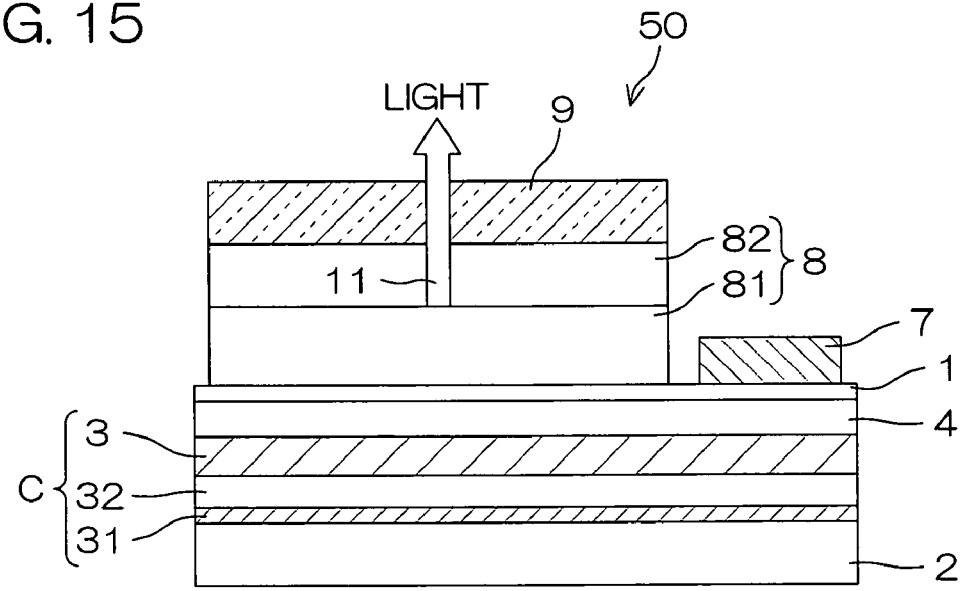
FIG. 15 is a schematic sectional view for describing an arrangement of a capacitor which corresponds to FIG. 3.

FIG. 14 and FIG. 15 are schematic sectional views for describing arrangements of the aforementioned capacitor C. FIG. 14 corresponds to the arrangement in FIG. 2, and FIG. 15 corresponds to the arrangement in FIG. 3. In the arrangement of FIG. 14, a transparent conductive film 21 formed of ITO, etc. and a transparent insulating film 22 formed of silicon oxide, etc. are interposed between a transparent substrate 2 and a gate electrode 3 formed of a transparent electrode film. The transparent conductive film 21 is disposed on the transparent substrate 2 side, and the transparent insulating film 22 is disposed on the gate electrode 3 side. This results in that a capacitor C which is interposed with the transparent insulating film 22 between the transparent conductive film 21 and the gate electrode 3 is formed.

In the arrangement of FIG. 15, a conductive film 31 made of metal, etc. and an insulating film 32 formed of silicon oxide, etc. are interposed between a substrate 2 and a gate electrode 3. The conductive film 31 is disposed on the transparent substrate 2 side, and the insulating film 32 is disposed at the gate electrode 3 side. This results in that a capacitor C which is interposed with the insulating film 32 between the conductive film 31 and the gate electrode 3 is formed. For example, when the substrate 2 is a semiconductor substrate such as silicon, the conductive film 31 can be formed of a conductive layer which is configured by a impurity diffusion layer formed on the surface of the substrate 2.

Figure 16A:
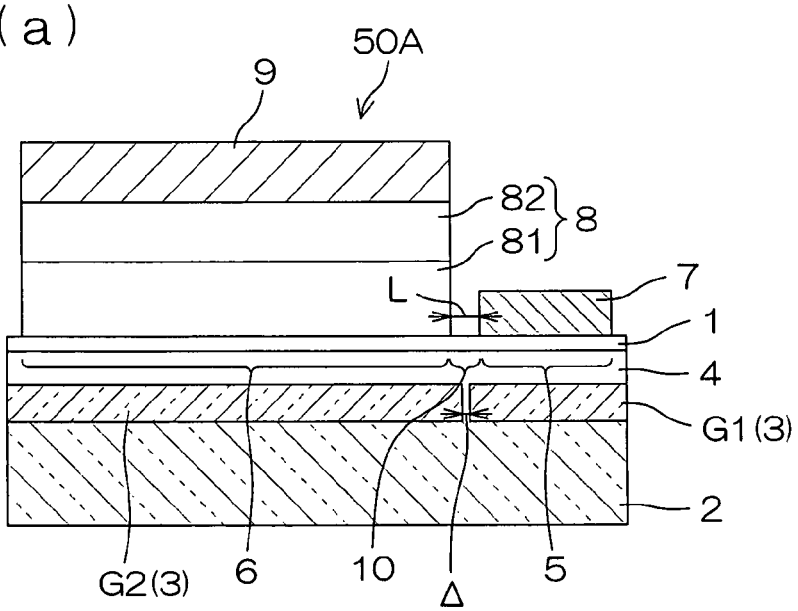
FIGS. 16(a) and 16(b) are diagrams for describing the arrangement of an organic semiconductor light-emitting device according to a second embodiment of the present invention.
Figure 16B:
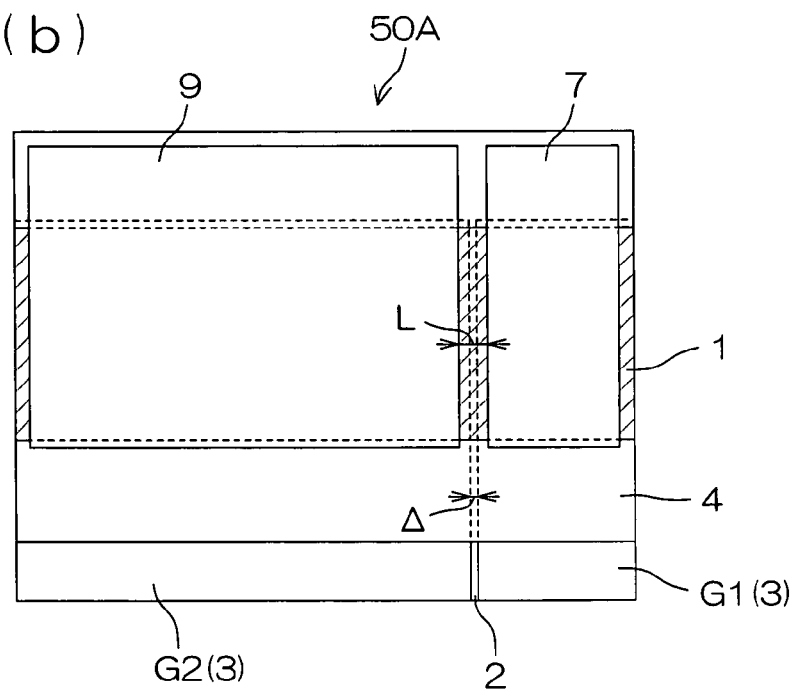

FIGS. 16(*a*) and 16(*b*) are diagrams for describing the arrangement of an organic semiconductor light-emitting device 50A according to a second embodiment of the present invention. FIG. 16(*a*) is a schematic sectional view of the arrangement, and FIG. 16(*b*) is a plan view of the arrangement. With the arrangement in FIG. 16, portions corresponding to the respective portions shown in FIG. 2 are provided with the same reference numerals as those of FIG. 2.

In the embodiment, a gate electrode 3 is divided into a first gate electrode G1 arranged on a source area 5 side and a second gate electrode G2 arranged on a drain area 6 side. The first gate electrode G1 faces to almost full area of the source area 5 via a gate insulating film 4, and extends to a channel area 10 side. Similarly, the second gate electrode G2 faces to almost full area of the drain area 6 via the gate insulating film 4 and extends to the channel area 10 side. A space A between the first gate electrode G1 and the second gate electrode G2 is set so as to be shorter than a channel length L which is a space between the source area 5 and the drain area 6.

Figure 17:
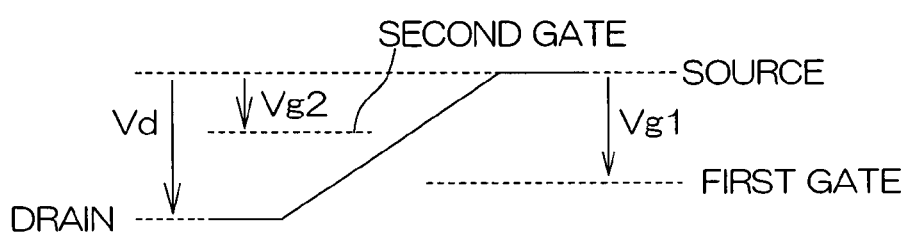
FIG. 17 is a diagram showing an example of potential respectively applied to a first and a second gate electrodes, a source electrode and a drain electrode of the device in FIG. 16.

FIG. 17 is a diagram showing an example of potentials respectively applied to a first gate electrode G1, a second gate electrode G2, a source electrode 7 and a drain electrode 9. The first gate electrode G1 and the second gate electrode G2 are electrically insulated from each other, to which voltages Vg1, Vg2 can be applied independently. This allows individual control of the amount of holes injected from the source electrode 7 to the organic semiconductor active layer 1, and the amount of electrons injected from the drain area 6 to the organic semiconductor light emitting part 8. Consequently, the balance of carriers being injected can be controlled, which can further enhance light emission efficiency in the organic semiconductor light emitting part 8.

Figure 18:
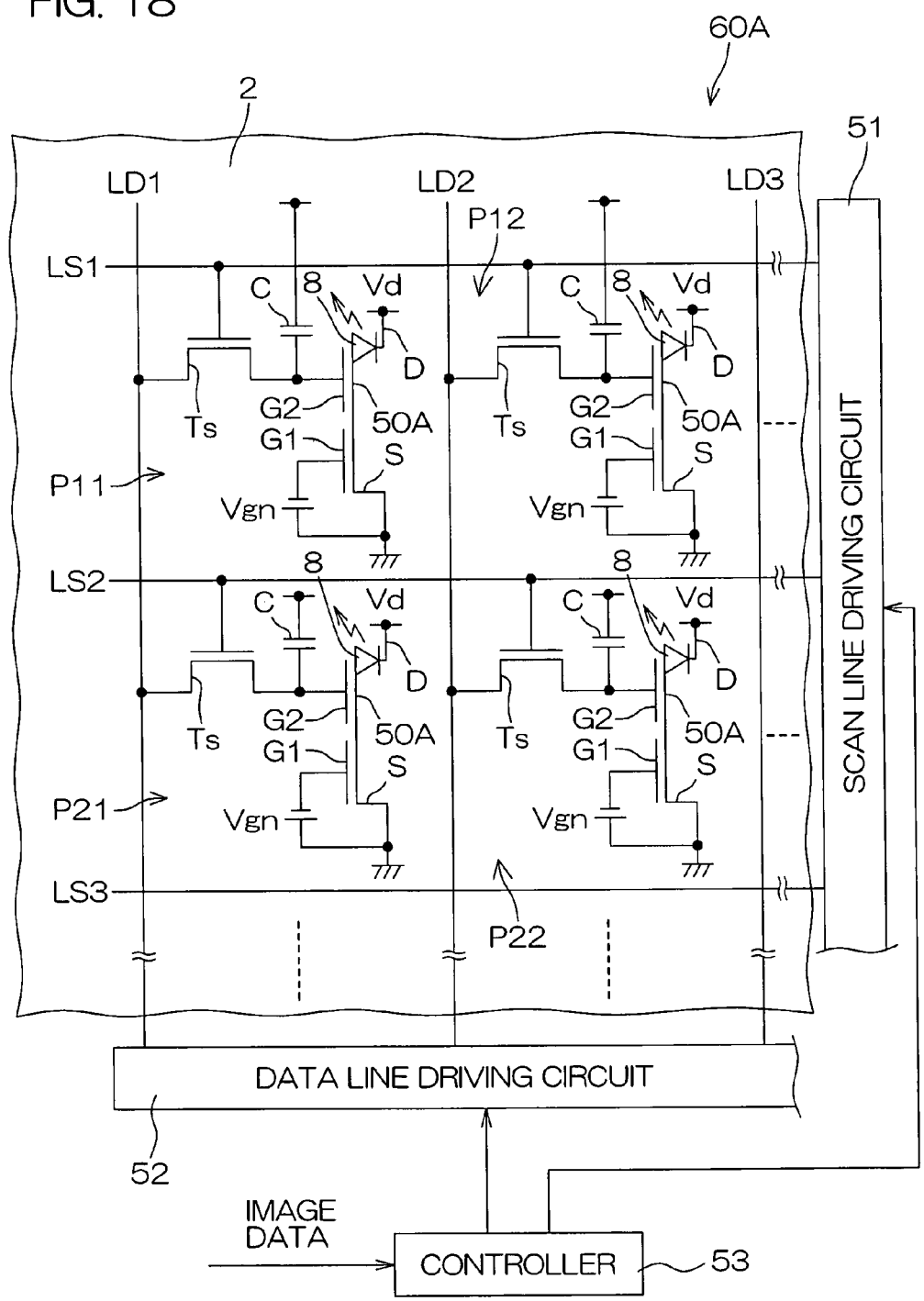
FIG. 18 is an electric circuit diagram of a display configured by two-dimensionally arranging organic semiconductor light-emitting devices shown in FIG. 16 on a substrate.

FIG. 18 is an electric circuit diagram of a display 60A configured by two-dimensionally arranging organic semiconductor light-emitting devices 50A shown in FIG. 16 on a substrate 2. In FIG. 18, portions corresponding to the respective portions shown in FIG. 13 are provided with the same reference numerals as those of FIG. 13.

The drain electrode 9(D), which is an electrode of the side where the organic semiconductor light emitting part 8 is arranged, is supplied with bias voltage Vd (<0), and the source electrode 7(S) is set at ground potential (=0). Furthermore, the first gate electrode G1 is applied with a certain control voltage Vgn (<0). On the other hand, to the second gate electrode G2, a selective transistor $T_s$ for selecting each pixel and a capacitor C for preserving data are connected in parallel. Other arrangements are similarly to the one in FIG. 13.

According to this arrangement, in each pixel of the selected line, a light emission control signal is transferred to the second gate electrode G2 through the selective transistor $T_s$, allowing the organic semiconductor light-emitting device 50A of the selected pixel to emit light (or distinguish light) at gradation in accordance with the light emission control signal.

In addition, by applying an light emission control signal from the data line LD1, LD2, . . . to the first gate electrode G1 with the potential of the second gate electrode G2 set to be fixed, similar operation can be enabled. Furthermore, individually controlling a control voltages applied to the first and the second gate electrodes G1, G2 according to image data allows display of more gradation.

The two embodiments of the present invention were described above, but this invention can be implemented in other embodiments. For example, in the above embodiments, the organic semiconductor light-emitting device having the basic form of a P-channel type field-effect transistor by use of the P-type organic semiconductor material for the organic semiconductor active layer 1 is described. As a matter of course, the organic semiconductor active layer 1 can be formed of the N-type organic semiconductor material which transports electrons. In this case, the organic semiconductor light-emitting device having the basic form of an N-channel type field-effect transistor is configured. In other words, electrons are injected from the source electrode 7 to the organic semiconductor active layer 1, while holes are injected from the drain electrode 9 to the organic semiconductor light emitting part 8. In this case, thus, when the organic semiconductor light emitting part 8 is configured with the hole transporting layer 81 and the electron transporting layer 82, the hole transporting layer 81 is arranged on the drain electrode 9 side, while the electron transporting layer 82 is arranged on the organic semiconductor active layer 1 side.

In addition, a so-called bipolar organic semiconductor material which can transport both electrons and holes can be used for the organic semiconductor active layer 1. Examples of applicable bipolar organic semiconductor material are described above.

The displays which can display two-dimensionally is shown in FIG. 13 and FIG. 18, but one-dimensional display also can be constructed by arranging pixels one-dimensionally.

Though the embodiments according to the present invention have been described in detail above, these are merely specific examples used to clarify the technical details of the present invention. The present invention should thus not be interpreted as being restricted to these specific examples and the spirit and the scope of the present invention are restricted only by the appended claims.

The present application corresponds to Japanese Patent Application No. 2004-250601 submitted to the Japan Patent Office on Aug. 30, 2004, the entire disclosure of which is incorporated herein by reference.

What is claimed is:

1. An organic semiconductor light-emitting device comprising:
    an organic semiconductor active layer as a transistor active layer, having a source area and a drain area set at an interval of a predetermined channel length;
    a source electrode joined to the source area of the organic semiconductor active layer;
    an organic semiconductor light emitting part joined directly to the drain area of the organic semiconductor active layer;
    a drain electrode joined to the organic semiconductor light emitting part; and
    a gate electrode disposed on the organic semiconductor active layer, with an insulating film sandwiched between the gate electrode and the organic semiconductor active layer, and extending to a region opposite to the entire source and drain areas, the gate electrode including a first gate electrode and a second gate electrode respectively facing the source area and the drain area, the first and second gate electrodes being electrically independent, with a space formed therebetween facing the interval between the source and drain areas, the gate electrode facing at least a region of the organic semiconductor active layer between the source area and the drain area, for controlling transportation of carriers between the source area and the drain area, wherein
    the organic semiconductor light emitting part includes an organic semiconductor light-emitting layer which is supplied with one of electrons and holes from the drain electrode, and is supplied with the other of the electrons and the holes from the organic semiconductor active layer, thereby generating light due to recombination of the electrons and the holes.

2. The organic semiconductor light-emitting device according to claim 1, wherein one of the source area and the drain area comprises a pair of regions set on both sides of the other of the source area and the drain area.

3. The organic semiconductor light-emitting device according to claim 1, wherein one of the source area and the drain area is set to surround the other of the source area and the drain area on at least three sides.

4. The organic semiconductor light-emitting device according to claim 1, wherein at least one of the gate electrode and the drain electrode includes a transparent electrode layer, and the organic semiconductor light-emitting device further includes a diffraction member adjacent to the transparent electrode layer, for diffracting light propagating in the transparent electrode layer in a normal line direction of the transparent electrode layer.

5. A display comprising a plurality of the organic semiconductor light-emitting devices according to claim 1 arranged on a substrate.

6. The organic semiconductor light-emitting device according to claim 1, wherein one of the source area and the drain area comprises a pair of regions set on both sides of the other of the source area and the drain area.

7. The organic semiconductor light-emitting device according to claim 1, wherein one of the source area and the drain area is set to surround the other of the source area and the drain area on at least three sides.

8. The organic semiconductor light-emitting device according to claim 1, wherein at least one of the gate electrode and the drain electrode includes a transparent electrode layer, and the organic semiconductor light-emitting device further includes a diffraction member adjacent to the transparent electrode layer, for diffracting light propagating in the transparent electrode layer in a normal line direction of the transparent electrode layer.

9. A display comprising a plurality of the organic semiconductor light-emitting devices according to claim 1 arranged on a substrate.

10. The organic semiconductor light emitting device of claim 1, wherein the source electrode is joined to the source area from a first side of the organic semiconductor active layer, the drain electrode is joined to the drain area from said first side, and the gate electrode is formed on a second side of the organic semiconductor active layer opposite to the first side.

11. The organic semiconductor light emitting device of claim 1, wherein the space between the first gate electrode and the second gate electrode is smaller than the interval between the source area and the drain area.

* * * * *